(12) United States Patent
Colongo et al.

(10) Patent No.: US 8,717,776 B2
(45) Date of Patent: May 6, 2014

(54) CONNECTION ASSEMBLY FOR AT LEAST ONE ITEM OF ELECTRONIC EQUIPMENT IN AN AIRCRAFT

(75) Inventors: Emile Colongo, Montesquieu Volvestre (FR); Pierre Salles, La Salvetat St Gilles (FR)

(73) Assignee: AIRBUS Operations S.A.S., Toulouse (FR)

( * ) Notice: Subject to any disclaimer, the term of this patent is extended or adjusted under 35 U.S.C. 154(b) by 247 days.

(21) Appl. No.: 13/021,432

(22) Filed: Feb. 4, 2011

(65) Prior Publication Data

US 2011/0198445 A1 Aug. 18, 2011

(30) Foreign Application Priority Data

Feb. 5, 2010 (FR) ...................................... 10 50835

(51) Int. Cl.
*H05K 7/02* (2006.01)
*H05K 7/04* (2006.01)

(52) U.S. Cl.
USPC ........................................... 361/807; 29/825

(58) Field of Classification Search
USPC ........................................... 361/807; 29/825
See application file for complete search history.

(56) References Cited

U.S. PATENT DOCUMENTS

| | | | | |
|---|---|---|---|---|
| 3,541,395 | A | * | 11/1970 | Lucchino ...................... 361/693 |
| 4,055,317 | A | * | 10/1977 | Greiss ......................... 244/118.5 |
| 4,089,040 | A | * | 5/1978 | Paulsen ......................... 361/691 |
| 4,153,225 | A | * | 5/1979 | Paulsen ...................... 244/118.1 |
| 4,549,602 | A | * | 10/1985 | Espinoza ..................... 165/80.2 |
| 5,381,314 | A | | 1/1995 | Rudy, Jr. et al. |
| 5,491,979 | A | * | 2/1996 | Kull et al. ........................ 62/185 |
| 5,548,489 | A | * | 8/1996 | Reed et al. ..................... 361/827 |

(Continued)

FOREIGN PATENT DOCUMENTS

| | | |
|---|---|---|
| EP | 1 380 196 A1 | 1/2004 |
| EP | 1 793 659 A1 | 6/2007 |

(Continued)

OTHER PUBLICATIONS

U.S. Appl. No. 13/021,511, filed Feb. 4, 2011, Colongo et al.

(Continued)

*Primary Examiner* — Bradley Thomas
*Assistant Examiner* — Theron Milliser
(74) *Attorney, Agent, or Firm* — Oblon, Spivak, McClelland, Maier & Neustadt, L.L.P.

(57) ABSTRACT

An assembly for connection of an electronic equipment item to wiring of an aircraft, in which the item of electronic equipment is disposed in a support means and includes connection means configured to be connected to the wiring, a connection interface disposed between the wiring and the connection means to provide connection of the item of electronic equipment to the wiring, the connection assembly configured to change over from a connected state in which the connection means are connected to the connection interface to a disconnected state in which the connection means are free. The connection interface is fastened to the structure of the aircraft; whether the connection assembly is in the connected or disconnected state. The support means is movable and includes an at least partially open face turned toward the connection interface and onto which the connection means emerge. The connection of the connection assembly to the connection interface is made by moving the support means between a first position where the connection assembly is in a disconnected state and a second position where it is in a connected state.

18 Claims, 6 Drawing Sheets

(56) References Cited

U.S. PATENT DOCUMENTS

| | | | |
|---|---|---|---|
| 6,018,456 A * | 1/2000 | Young et al. | 361/679.4 |
| 6,181,570 B1 * | 1/2001 | Ellebrecht et al. | 361/797 |
| 6,394,815 B1 * | 5/2002 | Sarno et al. | 439/61 |
| 6,667,891 B2 * | 12/2003 | Coglitore et al. | 361/796 |
| 7,142,411 B2 * | 11/2006 | McLeod | 361/624 |
| 7,193,850 B2 * | 3/2007 | Pal | 361/700 |
| 7,206,946 B2 * | 4/2007 | Sakakibara et al. | 713/300 |
| 7,239,523 B1 * | 7/2007 | Collins et al. | 361/752 |
| 7,280,371 B2 * | 10/2007 | Barsun et al. | 361/792 |
| 7,327,563 B2 * | 2/2008 | Cauthron | 361/679.55 |
| 7,408,772 B2 * | 8/2008 | Grady et al. | 361/679.48 |
| 7,473,931 B1 * | 1/2009 | Beseth et al. | 257/81 |
| 7,547,845 B2 | 6/2009 | Azemard | |
| 7,688,578 B2 * | 3/2010 | Mann et al. | 361/679.46 |
| 7,724,516 B2 * | 5/2010 | Harder et al. | 361/679.51 |
| 7,780,114 B2 * | 8/2010 | Doebertin et al. | 244/118.5 |
| 8,019,396 B2 * | 9/2011 | Wayman | 455/575.3 |
| D647,024 S * | 10/2011 | Tan | D12/345 |
| 8,259,466 B2 * | 9/2012 | Bridges et al. | 361/788 |
| 2003/0036347 A1 | 2/2003 | Lambiaso | |
| 2006/0060181 A1 * | 3/2006 | Sasaki et al. | 126/21 A |
| 2006/0145002 A1 * | 7/2006 | Van Loon | 244/118.1 |
| 2009/0002938 A1 * | 1/2009 | Stewart et al. | 361/687 |
| 2009/0195135 A1 | 8/2009 | Nemoz et al. | |
| 2011/0127379 A1 * | 6/2011 | Jager et al. | 244/118.1 |
| 2011/0194269 A1 * | 8/2011 | Colongo et al. | 361/807 |

FOREIGN PATENT DOCUMENTS

| | | |
|---|---|---|
| FR | 2 927 222 A1 | 8/2009 |
| WO | WO 02/085088 A1 | 10/2002 |
| WO | WO 2009/106430 A2 | 9/2009 |

OTHER PUBLICATIONS

French Preliminary Search Report issued Sep. 22, 2010, in French 1050835, filed Feb. 5, 2010 (with English Translation of Category of Documents).

* cited by examiner

CONNECTION ASSEMBLY FOR AT LEAST ONE ITEM OF ELECTRONIC EQUIPMENT IN AN AIRCRAFT

BACKGROUND OF THE INVENTION

This invention relates to a connection assembly for at least one item of electronic equipment in an aircraft.

In an aircraft, many items of electronic equipment are concentrated in a zone located underneath the cockpit of the aircraft, which provides the items of equipment with preferential environmental conditions such as a reasonable ambient pressure and a controlled ambient temperature. Support means are disposed in this zone and make it possible to fasten the items of equipment, connect them to the wiring of the aircraft and ventilate them.

The document US2004050569 describes and shows a known connection assembly, in which at least one item of electronic equipment is disposed in a support means. This support means is added onto a movable carrier structure. The carrier structure comprises a connection interface on which the support means comes to be connected. The assembly formed in this way is brought into the desired zone, alongside other assemblies formed separately and the wiring of the aircraft is added onto each connection interface integral with a support means.

SUMMARY OF THE INVENTION

The invention is intended to propose a connection assembly for an item of equipment simplified in comparison with the prior art, particularly in the installation, wiring and subsequent maintenance operations of the electronic assembly.

For this purpose, the invention has as an object an assembly for connection of at least one item of electronic equipment to wiring of an aircraft, in which the said at least one item of electronic equipment is disposed in a support means and comprises connection means adapted for being connected to the wiring of the aircraft, a connection interface being disposed between the wiring of the aircraft and the connection means to provide the connection of the said at least one item of electronic equipment to the said wiring, the said connection assembly being adapted for changing over from a connected state in which the connection means are connected to the connection interface, to a disconnected state in which the connection means are free,
characterized in that:
the said connection interface is fastened to the structure of the aircraft, whether the connection assembly is in the connected or disconnected state,
the support means is movable and comprises an at least partially covered face turned toward the connection interface and onto which the connection means emerge, and
the connection of the said connection assembly to the connection interface is accomplished by moving the support means between a first position where the connection assembly is in a disconnected state and a second position where it is in a connected state.

Such an assembly advantageously makes it possible to reduce the space requirement for the wiring of the aircraft as a result of the integration of the connection interface into the structure of the aircraft, and allows the use of a simplified modular support means because the connection interface is added directly onto the aircraft. Moreover, a pre-wiring is made possible between the connection interface and the wiring of the aircraft which provides a modularity and a saving of time in the assembly operations for an aircraft.

It will be noted that the face of the support means may be completely or partially open. In the case of partial opening, the connection means are disposed facing the opening or openings to allow connection to the opposite connection interface.

According to different characteristics:
the connection interface has a first face turned toward the interior of the aircraft, and a second face turned toward the structure of the aircraft, the wiring being added onto the said second face of the connection interface;
the connection means of the said at least one item of electronic equipment being called a first connection means, the connection interface comprises second connection means adapted for cooperating with the first connection means of the said at least one item of electronic equipment.

According to one characteristic, the connection interface comprises at least one panel which, on the one hand, is connected to the wiring of the aircraft and, on the other hand, bears the second connection means which are capable of cooperating with the first connection means.

It will be noted that, in general, the cable bundles constituting the wiring of the aircraft comprise at their ends connectors which are installed on the rear face of the panel, while the front face bears the second connection means.

According to one characteristic, the second connection means are installed at least in part on one or more electronic circuits (e.g.: electronic boards) attached to the panel.

The panel thus may comprise second connection means installed integrally on one or more electronic circuits of the panel.

Such a configuration is useful when it is necessary to add intelligence in addition to the physical implementation of the aircraft wiring-electronic equipment connections.

The addition of functionalities to the establishment of connections requires the use of an electronic circuit or electronic circuits.

It may be advantageous, for example, to control and/or manage functions performed in the items of equipment, to manage redundancy in the distribution of electric power to the items of equipment, to integrate protections against lightning, to switch connections between the wiring and items of equipment . . . .

Alternatively, the panel may comprise second connection means installed directly on the panel, without having recourse to electronic circuits.

This configuration may prove useful when it is wished to simplify the interface and disrupt the signals to be transmitted as little as possible.

This configuration is especially advantageous in the case of particularly simple or relatively complex signals.

Furthermore, direct installation is preferred for more complex connections such as those linked to the use of fiber optics, for reasons of ease of management.

According to a variant, the panel may comprise one or more electronic circuits bearing a part of the second connection means, while the other part of the second means is directly fastened onto the panel.

According to other characteristics:
the connection interface comprises at least one fixed panel connected to the wiring of the aircraft and bearing second connection means capable of cooperating with the first connection means of a first item of electronic equipment, and at least one movable panel bearing second connection means, the said panel being movable between a first position located in the plane of the said interface and in which a second item of electronic equipment is connected to the wiring of the aircraft through second connection means borne by the movable panel, and a second retracted position in which the second item of electronic equipment is connected directly to the wiring of the aircraft without the medium of the second connection means borne by the movable panel; the fact that the panel is movable makes it possible to access the wiring of the aircraft (for example for maintenance operations) without having to dismantle the connection interface;

the movable support means comprises at least one open face, the said at least one item of electronic equipment being disposed in the support means so that the first connection means borne by the said at least one item of electronic equipment emerge onto this open face;

guidance means are disposed on the structure of the aircraft, to guide the movable support means during its movement between a first and a second position;

the movable support means integrates a cooling system, autonomous or interconnected with the cooling system of the aircraft;

the movable support means has two opposite open faces, so that the first connection means of an item of electronic equipment emerge onto the first face, the item of electronic equipment being able to be inserted through the second face;

the connection interface is directly fastened onto the structure, or else fastened onto the structure through a stiffening or insulating element;

the movable support means comprises at least one rack on which the items of electronic equipment may be integrated, the said support means possibly comprising several racks disposed one above the other, and/or beside the other.

The invention also relates to a method for connection of at least one item of electronic equipment to wiring of an aircraft, in which there is at least one item of electronic equipment in a movable support means, the movable support means is brought into contact with a connection interface fastened onto the structure of the aircraft, then the first connection means and the second connection means borne by the connection interface are connected.

According to one characteristic, the connection of the connection interface to the wiring of the aircraft and the fastening of the connection interface onto the structure of the aircraft may be carried out in preliminary steps.

The invention also relates to an aircraft comprising at least one connection assembly for an item of electronic equipment according to the invention such as briefly set forth above.

BRIEF DESCRIPTION OF THE DRAWINGS

The characteristics and advantages of the invention will become apparent from the description that follows, provided by way of preferred, but not limitative, example, with reference to the attached drawings, on which.

DETAILED DESCRIPTION OF THE INVENTION

Figure 1:
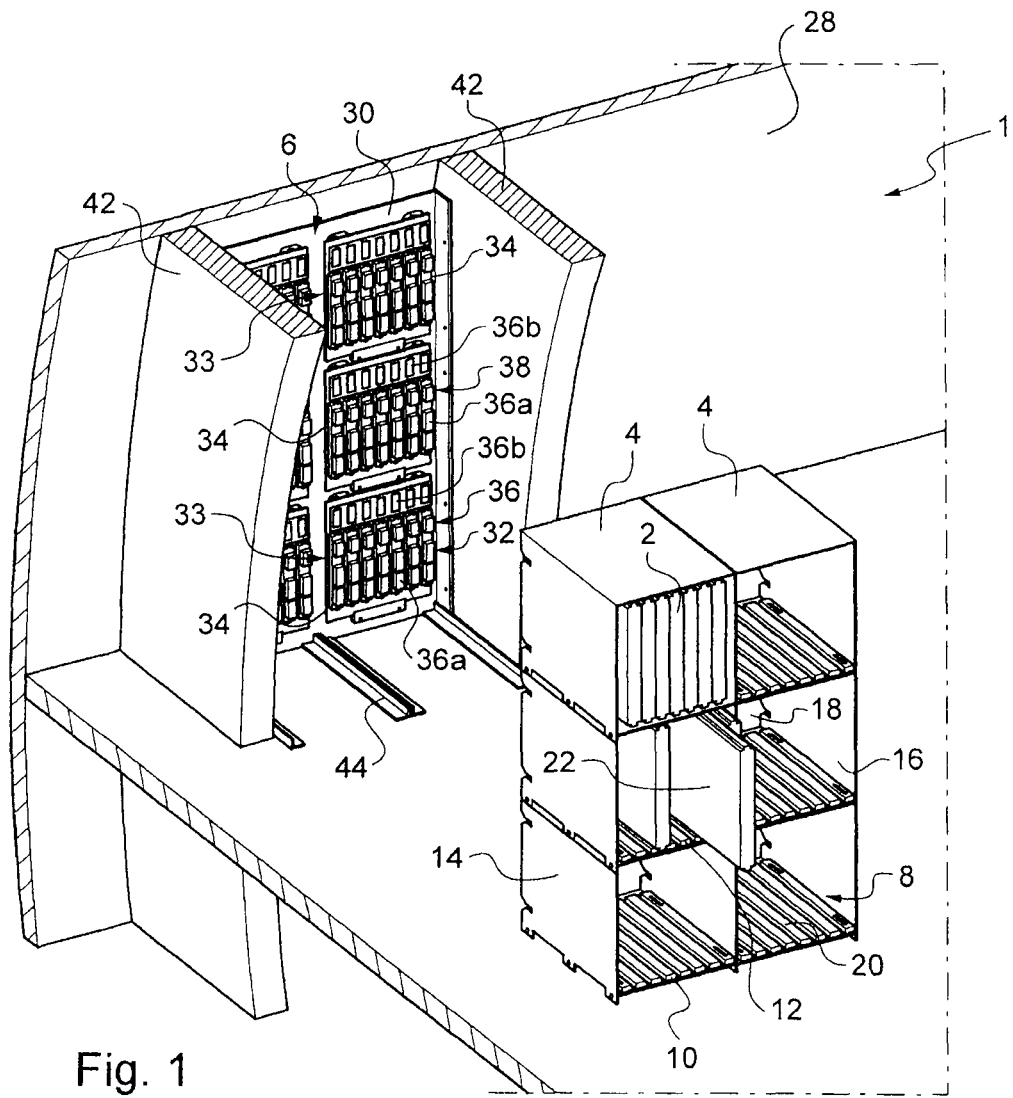
FIG. 1 is a schematic representation of a connection assembly according to a first embodiment of the invention, in which the support means is in a first position referred to as recessed.

Connection assembly 1 for an item of electronic equipment 2 comprises at least one movable support means 4 and a connection interface 6. The connection interface is disposed in an aircraft, and provides connection of items of electronic equipment 2 to the wiring of the aircraft.

Movable support means 4, illustrated on FIGS. 1 to 6, forms as it were a cabinet that comprises modules 8 with more or less rectangular section. Each module 8 comprises a lower rack 10 and an upper rack 12, connected by two side walls 14, which thus define a front face 16 and a rear face 18. The front face and the rear face of each module are, for example, open, without walls.

As illustrated on the Figures, three modules 8 here are stacked up one on the other, to form a given height of support means 4. Moreover, here, two columns of modules are positioned side by side. The six modules 8 have the same dimensions and are aligned so that each rear face 18 is included in the same vertical plane.

Slots 20 are arranged on opposing faces of the lower rack 10 and the upper rack 12 of the same module 8.

A module 8 is adapted for accommodating at least one item of electronic equipment 2, disposed vertically between lower rack 10 and upper rack 12 of the said module 8.

Figure 2:
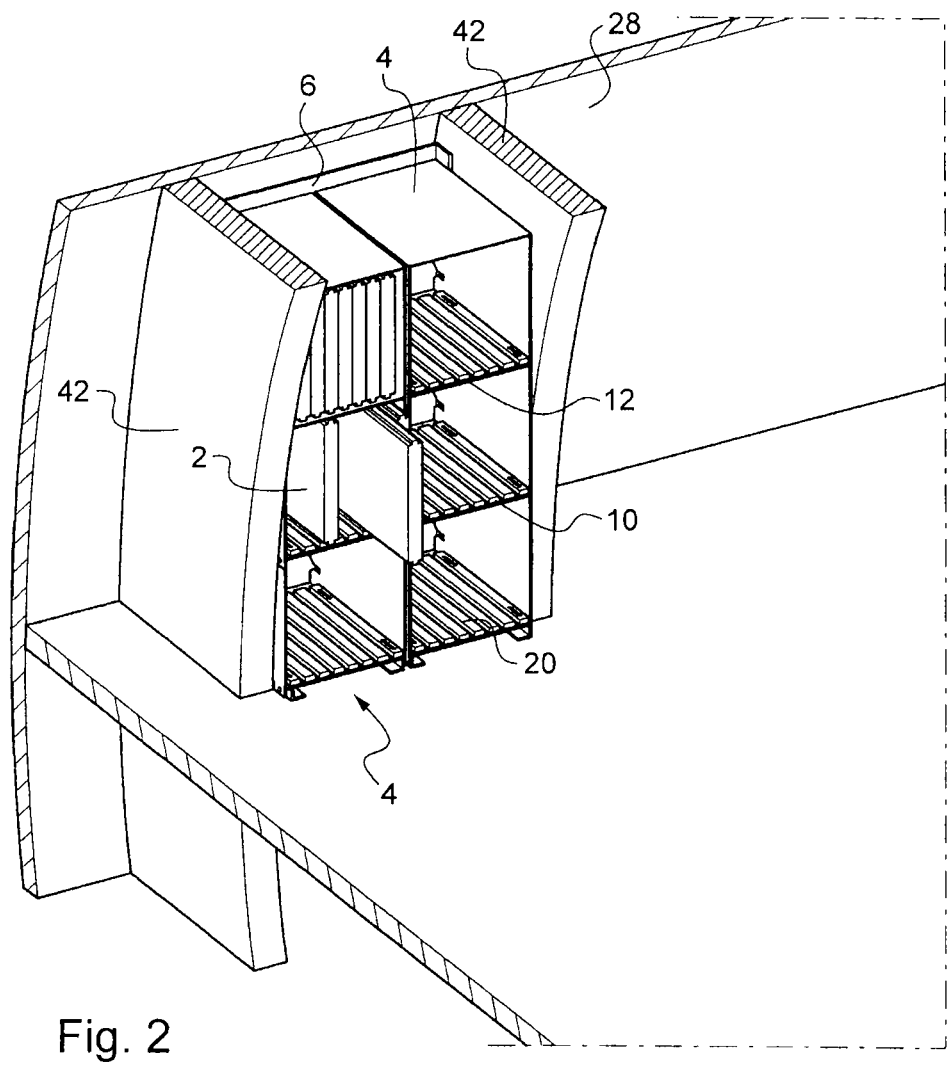
FIG. 2 is a schematic representation of the connection assembly of FIG. 1 in which the support means is in a second position referred to as active.

Item of electronic equipment 2 comprises an outer protective casing 22, as is visible in particular on FIG. 2. The casing comprises ribs 24 forming complementary guidance means adapted for cooperating with corresponding slots 20 arranged on lower and upper racks of support means 4. The said ribs 24 extend axially over an upper face and a lower face of casing 22.

Figure 5:
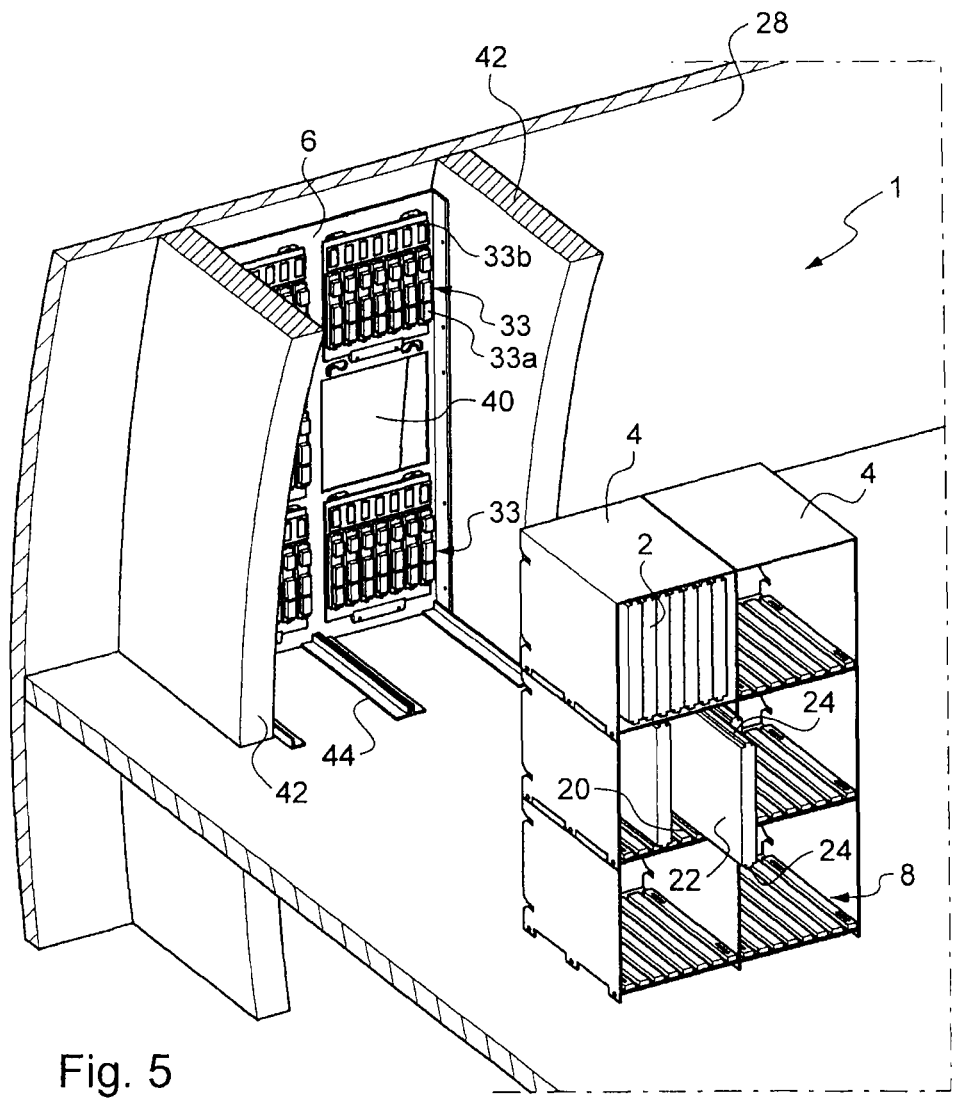
FIG. 5 is a schematic representation of an implementation variant of the assembly of FIG. 4, the movable panel being removed.

Casing 22 further comprises, on one face, referred to as rear, perpendicular to the upper and lower faces, first connection means 26 visible on FIG. 5. The said first connection means 26 of each item of electronic equipment 2 disposed in the support means emerge onto rear face 18 of support means 4.

At least one connection interface 6 is provided for connection of the wiring of the aircraft to first connection means 26 of items of electronic equipment 2 borne by support means 4.

As illustrated on FIG. 1, connection interface 6 is fastened to structure 28 of the aircraft.

Connection interface 6 is more or less plane. It extends vertically, and has a first face 30 turned toward the interior of the aircraft, and a second opposite face (not visible on the Figures) turned toward structure 28 of the aircraft. The wiring made up of cable bundles is added onto the said second face of connection interface 6 via connectors installed at the ends of the bundles.

When connection means 26 are connected to connection interface 6, the connection assembly is in a connected state, with corresponding items of electronic equipment 2 that are connected to the wiring through connection interface 6. When connection means 26 are free, that is to say that they are not connected to the connection interface, the connection assembly is in a disconnected state.

It will be observed that the connection interface is fastened to the structure of the aircraft irrespective of the connected or disconnected state of the connection assembly.

Connection interface 6 is fastened directly onto structure 28, for example through its second face. As a variant, insulating means or stiffening means are disposed between the said interface and the structure of the aircraft.

Figure 3:
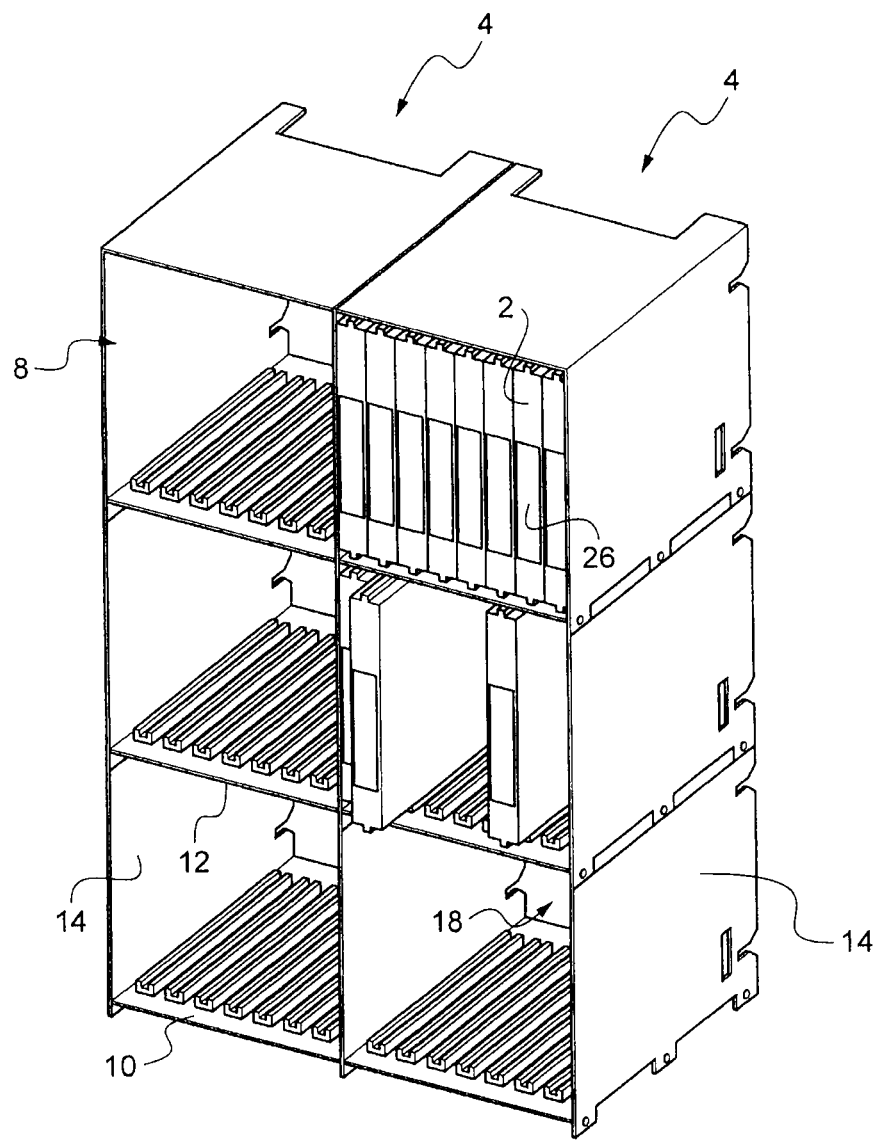
FIG. 3 is a schematic representation of the support means and the first connection means of items of electronic equipment, three-quarter rear view.

Connection interface 6, as illustrated on FIG. 1, comprises several panels 32, for example six. Each panel 32 comprises on one face printed circuits (electronic circuits) and second connection means 36. It will be noted that it may be a matter of a single printed circuit or several boards. Panels 32 are turned so that the face bearing the printed circuits, as well as the second connection means 36 is turned toward the interior of the aircraft. Said second connection means 36 then are capable of cooperating with first connection means 26 of items of electronic equipment 2 (FIG. 3).

The aforementioned panels may be of two types.

In a first type, printed circuits 34 cover a part of the panels and a part of the entirety of the second connection means (connectors) of these panels is installed on circuits 34 and is intended to cooperate with first means 26 for an indirect connection. This part is referenced 36a.

It will be noted that the connectors with which the cable bundles are equipped are, for example, fastened at the rear face of the printed circuits.

On a part of these panels that is not covered by printed circuits, the other part 36b of the second connection means is directly installed on the visible face (turned toward the interior of the aircraft) of the panel.

In this example, part 36b has a series of openings in which connectors with which the cable bundles are equipped are inserted, these connectors then being connected to first connection means 26 for a direct connection.

In this way the advantages of an indirect connection between the wiring of the aircraft and the items of electronic equipment (via connectors 36a installed on an electronic board or electronic boards) and a direct connection (connectors installed directly on the panel) are combined on the same panel.

The indirect connection is used when functionalities are added besides the simple transmission of signals via the interface: management of the power supply for items of equipment and the redundancy of this supply, switching of wiring-equipment item connections, monitoring of input/output functions of items of equipment, integration of protections against lightning (filtering of signals . . . ) . . . or, more generally, preliminary processing of certain signals (protection, formatting, . . . ) before transmitting them to items of electronic equipment 2.

The direct signal is used to transmit signals as rapidly as possible, to avoid disrupting the signals, and also to manage sensitive links (fiber optics) requiring complex connections . . . .

Furthermore, the panels of a second type may comprise, on the one hand, part 36b as described above for a direct connection aircraft wiring-electronic equipment item connection and, on the other hand, part 36a comprising one or more electronic boards 34 and connectors for a connection to the items of electronic equipment. On this type of panels, however, the rear face of the electronic boards is not connected to the connectors with which the cable bundles are equipped. In this way the signals conveyed by the wiring of the aircraft are transmitted directly via part 36b to the items of electronic equipment, then retransmitted to electronic boards 34.

According to a variant not shown, the interface comprises panels equipped to allow only a direct connection (only elements 36b of the panels of FIG. 1 are present) and/or panels equipped to allow only an indirect connection (panels comprising only one or more electronic boards 34 equipped with elements 36a of the panels of FIG. 1) and/or panels combining the two direct and indirect connection possibilities (panels of the first type described above) and/or panels of the second type described above.

In the example of FIGS. 1 to 3, the panels are installed in fixed manner on interface 6.

The functioning of connection assembly 1 now is going to be described.

Support means 4 is movable between two positions, a first position referred to as recessed, shown in FIG. 1, in which support means 4 is a given distance away from connection interface 6 and a second position referred to as active shown on FIG. 2, in which support means 4 is positioned near connection interface 6.

The first recessed position of support means 4 corresponds to the disconnected state of connection assembly 1, with first connection means 26 of items of electronic equipment 2 which are free of any connection, while the second active position of support means 4 corresponds to the connected state of connection assembly 1, with first connection means 26 which are connected to connection interface 6.

Support means 4 is moved in translation toward connection interface 6 from its first position to its second position. For this purpose, the support means may comprise means capable of facilitating its movement, such as casters, or grasping means for a handling device.

Guidance in translation is facilitated by the presence of guidance means disposed near connection interface 6. As illustrated on the Figures, these guidance means here are vertical walls 42, integral with structure 28 of the aircraft and surrounding the connection interface, as well as guidance rails 44 set up on the floor between walls 42, in front of the interface.

The connection of at least one item of electronic equipment 2 to the wiring of the aircraft then requires placing said item of electronic equipment 2 in movable support means 4, then bringing movable support means 4 close to connection interface 6 fastened onto structure 28 of the aircraft and connected to the wiring. Then first connection means 26 of items of electronic equipment 2 borne by the support means are connected with the second connection means borne by connection interface 6, whether or not these second means are installed directly on a panel. The connection assembly then is in the connected state described above.

Prior to these steps of connection and movement of the movable support means, connection interface 6 which is separated from items of electronic equipment 2 is connected to the wiring of the aircraft via the connectors with which the ends of the cable bundles are equipped, then the said interface 6 is fastened onto structure 28 of the aircraft.

According to a variant, connection interface 6 is fastened onto structure 28 of the aircraft before connecting said interface 6 to the wiring of the aircraft.

It will be noted that the aforesaid steps may be performed in separate places. Support means 4 may be brought inside the aircraft in a shop for assembly of the items of equipment, while connection interface 6 already has been fastened to structure 28 in the aircraft manufacturing plants.

It should be noted that in the embodiments shown, the items of electronic equipment may be installed in the support means irrespective of the position of the said support means.

Figure 4:
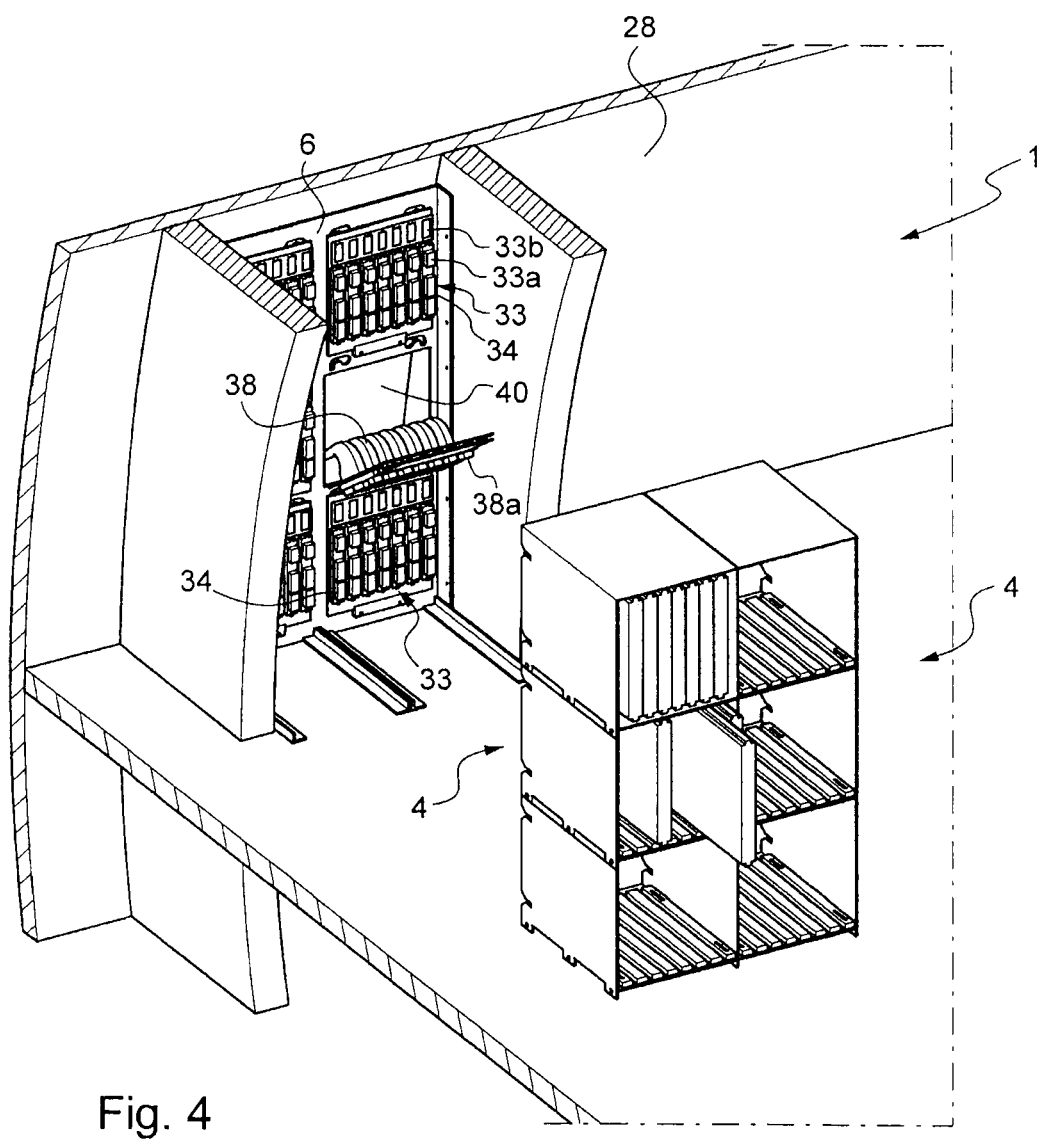
FIG. 4 is a schematic representation equivalent to FIGS. 1 and 2, of a connection assembly according to another exemplary implementation of the invention, the support means being in a first position referred to as recessed, the movable panel being in a second position referred to as retracted.

FIGS. 4 and 5 illustrate an exemplary implementation that allows an item of electronic equipment 2 to be directly connected to the wiring of the aircraft without the medium of connection interface 6, movable panel 38 of said interface 6 being retracted.

In this example, the panels here comprise fixed panels 33 and a panel 38 movable in relation to connection interface 6. Movable panel 38 is installed detachably in order to assume a first position identical to that illustrated on FIG. 1 for the fixed panels, located in the plane of connection interface 6, and a second position referred to as retracted and illustrated on FIG. 4, in which a passage 40 is created through connection interface 6.

Movable panel 38 bears second connection means 38a while fixed panels 33 of connection interface 6 bear second connection means 33a and 33b identical to second means 36a and 36b of FIG. 1. In this way, second connection means 38a borne by a movable panel 38 are adapted for cooperating with the connection means of a first item of electronic equipment 2, while second connection means 33a, 33b borne by a fixed panel 33 are adapted for cooperating simultaneously or otherwise with the connection means of a second item of electronic equipment 2.

As illustrated on FIG. 4, movable panel 38 is jointed on the connection interface, and said movable panel 38 is retracted by causing it to pivot around its joint. The active position of support means 4 then is as close as possible to connection interface 6 without, however, being in contact as a result of the presence of pivoted movable panel 38.

In this way the jointed movable panel allows the user to change over from a position located in the plane of the connection interface to a retracted position without removing the movable panel from the connection interface, and therefore without posing a problem of storage of this movable panel for the user.

Support means 4 then is brought close to connection interface 6 and the wiring of the aircraft is passed through passage 40 left by retracted movable panel 38, to be connected directly to the item of electronic equipment.

In a variant illustrated on FIG. 5, movable panel 38 is retracted by removing it. This has the advantage of being able to move support means 4 in translation against connection interface 6 when movable panel 38 is retracted. In this way it is possible at the same time to connect items of electronic equipment directly to the wiring of the aircraft via passage 40 created by the retraction of this movable panel 38, and to connect the other items of electronic equipment through connection interface 6 and second connection means 33a, 33b borne by the fixed panels.

Figure 6:
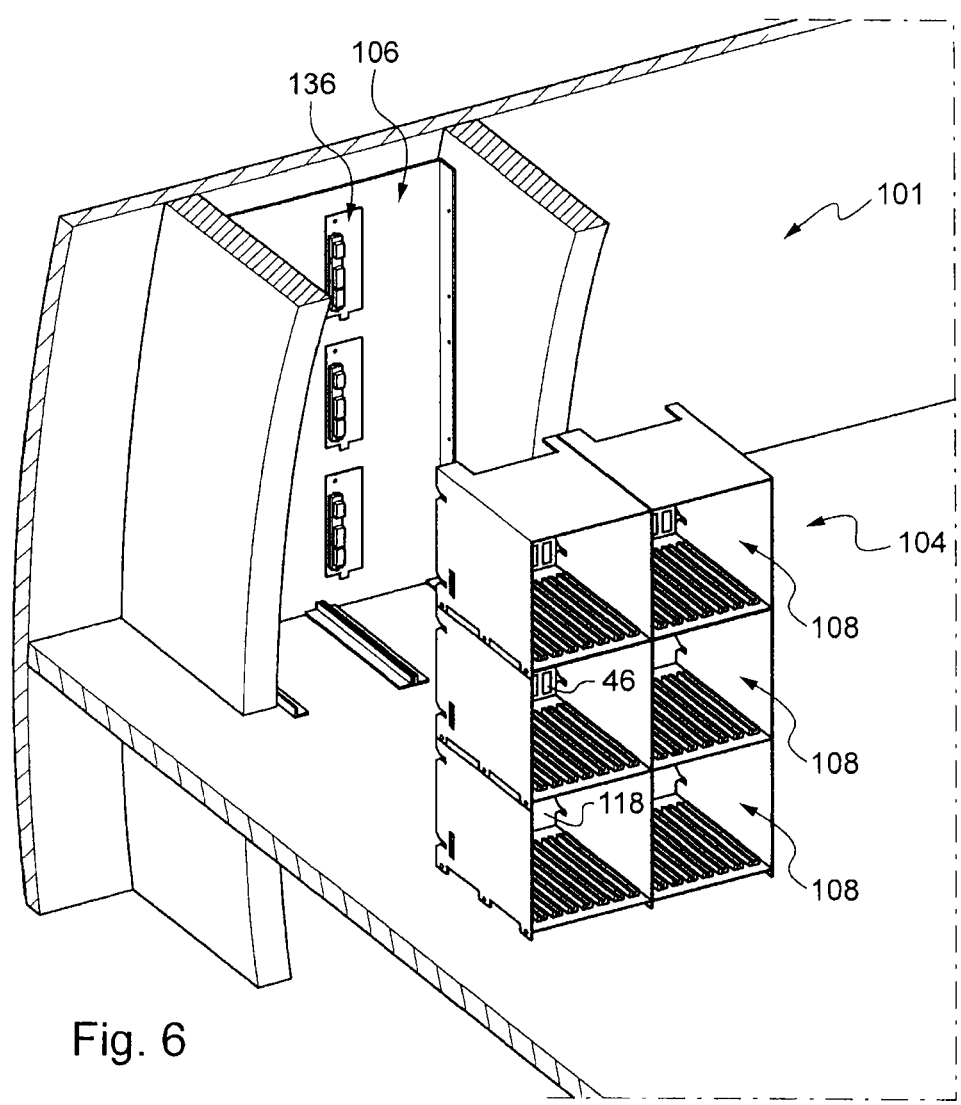
FIG. 6 is a schematic representation equivalent to FIG. 1, of a connection assembly according to yet another exemplary implementation of the invention, the support means being in a first position referred to as recessed.

There now is going to be described another exemplary implementation of a connection assembly 101, illustrated on FIG. 6, in this case comprising a support means 104 and a connection interface 106.

Support means 104 is by and large similar to support means 4, apart from the fact that the rear face 118 of each module 108 that comprises support means 104 has a closing wall 46. In each module 108, the items of electronic equipment are connected on said closing wall 46, which has on its outer surface, turned toward the outside of the support means, a first sole connection means, not shown.

Connection interface 106 is more or less plane and bears second connection means 136 adapted for cooperating with the sole connection means facing each module 108 of support means 104.

This configuration is useful, for example, for distributing different functionalities between the connection interface and the movable support means.

In this way, certain more sensitive functionalities are borne by the interface that is produced by the aircraft manufacturer, such as, for example, the integration of a function for protection against lightning (e.g.: signal filtering . . . ) or the integration of complex connectors (e.g.: optical . . . ) . . . .

Other less sensitive functionalities may be deported to the support means and thus be produced by subcontractors. These functionalities are, for example, less complex to produce and therefore less costly.

Moreover, the support means thereby is simplified.

For example, the support means generally is simpler to manufacture if the electrical signals are already processed beforehand (for example filtered for the purpose of a protection against lightning) and/or if they are electrical rather than optical . . . .

According to the previous embodiment described, the connection interface may bear fixed or movable panels.

In variants of the device according to the invention which are not shown, the different characteristics that follow may be taken individually or in combination:

the connection interface comprises a number of panels other than six, for example only one; the support means correspondingly comprises a number of modules other than six, for example only one;

the connection interface comprises only movable panels;

the support means has a form other than the one described, for example a form involving a horizontal arrangement of the modules; the support means is not movable but is added on against the connection interface, with a connection interface fastened to the structure of the aircraft prior to installation of the support means; the items of electronic equipment are directly connected to the connection interface without the medium of a support means;

the support means comprises a sole open face, with the opposite face which is closed; the first connection means borne by each item of electronic equipment emerge onto this open face, and the items of electronic equipment are inserted into the support means through this open face;

the guidance means are different, for example being located along different orientations;

the connection interface integral with the structure of the aircraft is not positioned against a side wall of the aircraft, but in a central part of the aircraft; and the support means integrates a cooling system, autonomous or dependent on the cooling system of the aircraft.

The invention claimed is:

1. A connection assembly for connection of at least one item of electronic equipment to wiring of an aircraft, the connection assembly comprising:

a movable support means in which the at least one item of electronic equipment is disposed in;

the at least one item of electronic equipment includes a connection means configured to connect to the wiring of the aircraft;

a connection interface including:
at least one opening,
at least one passage,
a joint,
at least one panel having one or more printed electronic circuits, being attached to the joint, and being disposed between the wiring of the aircraft and the connection means, the at least one panel pivots about the joint from a first panel position in a plane of the at least one passage to a second panel position retracted from the at least one passage,
- a first connection state in which the connection means is connected indirectly to the wiring of the aircraft through the one or more printed electronic circuits of the at least one panel,
- a second connection state in which the connection means is connected directly to the wiring of the aircraft through the at least one opening, and
- a third connection state in which the connection means is connected directly to the wiring of the aircraft through the at least one passage and the at least one panel is in the second panel position; and the connection assembly is configured to change from a connected state in which the connection means are connected to the connection interface at least in the first connection state or the second connection state, to a disconnected state in which the connection means are free, wherein the connection interface is fastened to a structure of the aircraft in the connected state and the disconnected state, the movable support means includes an open front face into which the at least one item of electronic equipment is inserted, and connection of the connection assembly is accomplished by moving the movable support means between a first position where the connection assembly is in the disconnected state and a second position where the connection assembly is in the connected state.

2. The connection assembly according to claim 1, wherein the connection interface has a first face turned toward the interior of the aircraft, and a second face turned toward the structure of the aircraft, the wiring of the aircraft being added onto the second face of the connection interface.

3. The connection assembly according to claim 1, wherein, the connection means of the at least one item of electronic equipment being a first connection means, the connection interface includes second connection means on the one or more printed electronic circuits configured to cooperate with the first connection means of the at least one item of electronic equipment in the first connection state.

4. The connection assembly according to claim 1, wherein the movable support means includes an open rear face and the connection means borne by the at least one item of electronic equipment emerge onto the open rear face.

5. The connection assembly according to claim 4, wherein guidance means are disposed on the structure of the aircraft, to guide the movable support means during its movement between the first position and the second position.

6. The connection assembly according to claim 5, wherein the structure of the aircraft on which the guidance means are disposed is the floor of the aircraft.

7. An aircraft including at least one connection assembly for at least one item of electronic equipment according to claim 1.

8. The connection assembly according to claim 1, wherein the connection interface is shaped in a plane.

9. The connection assembly according to claim 1, wherein the movable support means includes an upper rack having first slots and a lower rack having second slots,
wherein the at least one item of electronic equipment is disposed in a first slot of the upper rack and a corresponding second slot of the lower rack.

10. The connection assembly according to claim 9, wherein the at least one opening is provided in a second panel of the connection interface, and
wherein at least one opening corresponds to the first slot and the corresponding second slot.

11. The connection assembly according to claim 10, wherein connectors of the wiring of the aircraft are inserted in the at least one opening to directly connect the wiring of the aircraft to the connection means in the second connection state.

12. The connection assembly according to claim 9, wherein the at least one opening is provided in the at least one panel, and
wherein the at least one opening corresponds to the first slot and the corresponding second slot.

13. A method for connection of at least one item of electronic equipment to wiring of an aircraft, comprising:
- inserting at least one item of electronic equipment into a movable support means through an open first face of the support means, so that connection means borne by the item of electronic equipment emerge onto an at least partially open rear face of the movable support means;
- pivoting at least one panel including one or more printed circuits about a joint attached to a connection interface fastened onto the structure of the aircraft to cause the at least one panel to be in a plane of a passage of the connection interface;
- bringing the mobile support means close to the connection interface, the at least partially open rear face of the support means being turned toward the connection interface; and
- connecting the connection means to the connection interface with the connection means indirectly connected to the wiring of the aircraft through the one or more printed circuits of the at least one panel in a first connection state of the connection interface or directly connected to the wiring of the aircraft in a second connection state of the connection interface.

14. The connection assembly according to claim 1, wherein the open front face of the movable support means does not include a wall.

15. The connection assembly according to claim 1, wherein the movable support means is a cabinet with two columns of rectangularly-shaped modules, each module including a lower rack and an upper rack.

16. The connection assembly according to claim 15, wherein each column includes three modules.

17. The connection assembly according to claim 15, wherein at least the lower rack includes slots for receiving an item of electronic equipment.

18. A connection assembly for connection of at least one item of electronic equipment to wiring of an aircraft, the connection assembly comprising:
- a movable support means in which the at least one item of electronic equipment is disposed in;
- the at least one item of electronic equipment includes a connection means configured to connect to the wiring of the aircraft;
- a connection interface including:
  - at least one opening;
  - at least one passage;
  - a joint,
  - at least one panel having one or more printed electronic circuits, being attached to the joint, and being disposed between the wiring of the aircraft and the connection means, the at least one panel pivots about the joint from a first panel position in a plane of the at least one passage to a second panel position retracted from the at least one passage, a first connection state in which the connection means is connected indirectly to the wiring of the aircraft via the one or more printed electronic circuits of the at least one panel, a second connection state in which the connection means is connected directly to the wiring of the aircraft through the at least one opening, and a third connection state in which the connection means is connected directly to the wiring of the aircraft through the at least one passage and the at least one panel is in the second panel position; and the connection assembly configured to change over from a connected state in which the connection means are connected to the connection interface at least in the first connection state or the second connection state, to a disconnected state in which the connection means are free, wherein the connection interface is fastened to a structure of the aircraft in the connected state and the disconnected state, the movable support means is a cabinet that includes modules configured to accommodate the at least one item of electronic equipment, and connection of the connection assembly is accomplished by moving of the movable support means between a first position where the connection assembly is in the disconnected state and a second position where the connection assembly is in the connected state.

\* \* \* \* \*